United States Patent
Zhou et al.

(10) Patent No.: US 12,268,035 B2
(45) Date of Patent: Apr. 1, 2025

(54) ULTRAVIOLET DETECTOR AND PREPARATION METHOD THEREFOR

(71) Applicant: THE 13TH RESEARCH INSTITUTE OF CHINA ELECTRONICS TECHNOLOGY GROUP CORPORATION, Shijiazhuang (CN)

(72) Inventors: Xingye Zhou, Shijiazhuang (CN); Xin Tan, Shijiazhuang (CN); Yuanjie Lv, Shijiazhuang (CN); Yuangang Wang, Shijiazhuang (CN); Xubo Song, Shijiazhuang (CN); Shixiong Liang, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 430 days.

(21) Appl. No.: 17/684,999

(22) Filed: Mar. 2, 2022

(65) Prior Publication Data

US 2022/0190175 A1    Jun. 16, 2022

Related U.S. Application Data

(63) Continuation of application No. PCT/CN2019/126518, filed on Dec. 19, 2019.

(30) Foreign Application Priority Data

Sep. 5, 2019  (CN) .......................... 201910837936.2

(51) Int. Cl.
  *H10F 77/14*   (2025.01)
  *H10F 71/00*   (2025.01)
  (Continued)

(52) U.S. Cl.
  CPC ....... *H10F 77/147* (2025.01); *H10F 71/1215* (2025.01); *H10F 30/225* (2025.01);
  (Continued)

(58) Field of Classification Search
  CPC ......... H01L 31/035281; H01L 31/1812; H01L 31/02161; H01L 31/022416; H01L 31/028;
  (Continued)

(56) References Cited

U.S. PATENT DOCUMENTS 5,093,576 A * 3/1992 Edmond ............. H01L 31/0312
                                              257/466
2001/0042869 A1* 11/2001 Fujimura .......... H01L 31/03046
                                              257/E31.022

(Continued)

FOREIGN PATENT DOCUMENTS

CN    102931272 A    2/2013
CN    107154447 A    9/2017

*Primary Examiner* — Sitaramarao S Yechuri
(74) *Attorney, Agent, or Firm* — AP3 Law Firm PLLC

(57) ABSTRACT

A ultraviolet detector includes a substrate; a first epitaxial layer that is a heavily doped epitaxial layer and located on the substrate, a second epitaxial layer located on the first epitaxial layer, where the second epitaxial layer is a lightly doped epitaxial layer, or a double-layer or multi-layer structure composed of at least one lightly doped epitaxial layer and at least one heavily doped epitaxial layer; an ohmic contact layer located on the second epitaxial layer or formed in the second epitaxial layer, where the ohmic contact layer is a graphical heavily doped layer; and a first metal electrode layer located on the ohmic contact layer.

5 Claims, 6 Drawing Sheets

(51) Int. Cl.
*H10F 30/225* (2025.01)
*H10F 77/122* (2025.01)
*H10F 77/20* (2025.01)
*H10F 77/30* (2025.01)

(52) U.S. Cl.
CPC .......... *H10F 77/122* (2025.01); *H10F 77/241* (2025.01); *H10F 77/306* (2025.01)

(58) Field of Classification Search
CPC ............... H01L 31/107; H01L 31/1075; H01L 31/022408; H01L 31/1804; H10F 77/147; H10F 77/122; H10F 77/241; H10F 77/306; H10F 71/1215; H10F 71/1224; H10F 30/225; H10F 39/024; H10D 62/108; H10D 64/517; A61K 40/44
See application file for complete search history.

(56) References Cited

U.S. PATENT DOCUMENTS

| | | | |
|---|---|---|---|
| 2004/0195518 A1* | 10/2004 | Chi | G01J 1/429 438/93 |
| 2005/0173712 A1* | 8/2005 | Nakajima | H01L 31/022416 257/E31.038 |
| 2006/0125040 A1* | 6/2006 | Levin | H01L 29/872 257/E27.068 |
| 2007/0267653 A1* | 11/2007 | Yoneda | H01L 31/03529 257/E31.039 |
| 2010/0301309 A1* | 12/2010 | Tennant | B82Y 20/00 257/E21.294 |
| 2015/0076647 A1* | 3/2015 | Tatum | H01L 31/107 257/438 |
| 2015/0099324 A1* | 4/2015 | Wojtczuk | H01L 31/1844 438/74 |
| 2016/0005903 A1* | 1/2016 | Wenham | C25D 7/12 438/87 |
| 2017/0244002 A1* | 8/2017 | Campbell | H01L 31/03046 |
| 2018/0090525 A1* | 3/2018 | Barker | H01L 31/108 |

* cited by examiner

ULTRAVIOLET DETECTOR AND PREPARATION METHOD THEREFOR

CROSS-REFERENCE TO RELATED APPLICATIONS

This application is a continuation of International Application No. PCT/CN2019/126518, filed on Dec. 19, 2019, which claims priority to Chinese Patent Application No. 201910837936.2, filed on Sep. 5, 2019. The disclosures of the aforementioned applications are hereby incorporated by reference in their entireties.

TECHNICAL FIELD

The disclosure relates to the technical field of semiconductor, in particular to an ultraviolet detector and a preparation method therefor.

BACKGROUND

In recent years, research on semiconductor-based solid-state ultraviolet detectors has received more and more international attention. For example, the 4H—SiC avalanche photodiode ultraviolet detectors have the advantages of high gain, high responsivity, and low dark current, which can achieve detection of weak ultraviolet signals and even ultraviolet single photons. In the field of semiconductor, doping refers to the introduction of impurities into semiconductors. According to the concentration of the dopant, it is mainly divided into heavy doping, medium doping and light doping. Heavy doping means that the dopant concentration is relatively high, and light doping represents a relatively low dopant concentration.

However, there are two types of ultraviolet detectors: back-incidence type and front-incidence type. The back-incidence type ultraviolet detector can greatly reduce the quantum efficiency of the detector due to the absorption of photons by the substrate; While, due to the existence of the heavily doped ohmic contact layer on the top layer of the traditional front-incidence ultraviolet detector, a large number of short-wavelength photons are absorbed by the ohmic contact layer, thereby reducing the quantum efficiency.

SUMMARY

These and other problems are generally solved or circumvented, and technical advantages are generally achieved, by embodiments of the present disclosure which provide an ultraviolet detector and a preparation method therefor.

Technical Problems

In view of this, the disclosure aims to provide an ultraviolet detector and a preparation method therefor to solve the problem of low quantum efficiency of the ultraviolet detector in the prior art.

Technical Solutions

A first aspect of the embodiment of the present application provides an ultraviolet detector, the ultraviolet detector includes a substrate, a first epitaxial layer, a second epitaxial layer, an ohmic contact layer and a first metal electrode layer.

The first epitaxial layer is located on the substrate, and the first epitaxial layer is a heavily doped epitaxial layer.

The second epitaxial layer is located on the first epitaxial layer, and the second epitaxial layer is a lightly doped epitaxial layer, or the second epitaxial layer is a double-layer or multi-layer structure including at least one lightly doped epitaxial layer and at least one heavily doped epitaxial layer.

The ohmic contact layer is located on the second epitaxial layer or formed in the second epitaxial layer, and the ohmic contact layer is a graphical heavily doped layer, wherein when the ohmic contact layer is formed in the second epitaxial layer, an upper surface of the ohmic contact layer is not lower than an upper surface of the second epitaxial layer, and a lower surface of the ohmic contact layer is higher than a lower surface of the second epitaxial layer.

And the first metal electrode layer is located on the ohmic contact layer.

Based on the first aspect, in a first possible implementation manner, the first epitaxial layer is a P-type silicon carbide epitaxial layer, the second epitaxial layer is an N-type silicon carbide epitaxial layer, and the ohmic contact layer is an N-type ohmic contact layer; or the first epitaxial layer is an N-type silicon carbide epitaxial layer, the second epitaxial layer is a P-type silicon carbide epitaxial layer, and the ohmic contact layer is a P-type ohmic contact layer.

Based on the first possible implementation manner of the first aspect, in a second possible implementation manner, a surface area of the first metal electrode layer is not larger than a surface area of the ohmic contact layer, and a surface graphic of the first metal electrode layer corresponds to a surface graphic of the ohmic contact layer.

Based on the second possible implementation manner of the first aspect, in a third possible implementation manner, the surface graphic of the ohmic contact layer includes any one of a circular ring, a square ring, a window shape and an array shape.

Based on the first aspect and any of the above possible implementation manners of the first aspect, in a fourth possible implementation manner, the ultraviolet detector further includes a passivation protection layer that covers an area on an outer surface of the second epitaxial layer without covering an outer surface of the first metal electrode layer.

Based on the fourth possible implementation manner of the first aspect, in a fifth possible implementation manner, a surface area of the second epitaxial layer is smaller than a surface area of the first epitaxial layer, and the second epitaxial layer and a partial area on the first epitaxial layer together form an isolation mesa, and wherein the partial area represents a region within which the second epitaxial layer is located on the first epitaxial layer.

And the ultraviolet detector further comprises a second metal electrode layer, and the second metal electrode layer is formed on an area on the first epitaxial layer other than the isolation mesa.

Based on the fourth possible implementation of the first aspect, in a sixth possible implementation manner, the substrate is a heavily doped substrate; and the ultraviolet detector further includes a second metal electrode layer, the substrate has two opposite sides, the first epitaxial layer is formed on one side of the two opposite sides, and the second metal electrode layer is formed on the other side of the two opposite sides.

A second aspect of the embodiment of the present application provides a preparation method of ultraviolet detector, the preparation method includes a wafer preparation step, an ohmic contact layer preparation step, an active region preparation step and a first metal electrode layer preparation step.

The wafer preparation step: preparing a first semiconductor epitaxial wafer or a second semiconductor epitaxial wafer, wherein the first semiconductor epitaxial wafer includes a substrate, a first epitaxial layer and a second epitaxial layer in an order from bottom to top; the second semiconductor epitaxial wafer includes a substrate, a first epitaxial layer, a second epitaxial layer and a third epitaxial layer in an order from bottom to top; wherein the first epitaxial layer of the first semiconductor epitaxial wafer and the first epitaxial layer of the second semiconductor epitaxial wafer being a heavily doped epitaxial layer; the second epitaxial layer of the first semiconductor epitaxial wafer and the second epitaxial layer of the second semiconductor epitaxial wafer being a lightly doped epitaxial layer, or the second epitaxial layer of the first semiconductor epitaxial wafer and the second epitaxial layer of the second semiconductor epitaxial wafer being a double-layer or multi-layer structure including at least one lightly doped epitaxial layer and at least one heavily doped epitaxial layer; and the third epitaxial layer being a heavily doped epitaxial layer.

The ohmic contact layer preparation step: for the first semiconductor epitaxial wafer, preparing a mask layer on a surface of the second epitaxial layer, coating a photoresist on the mask layer, photoetching on the photoresist and the mask layer to form a graphical ion implantation window, performing ion implantation through the graphical ion implantation window to form a graphical ohmic contact layer, and removing the photoresist and the mask layer which have been photoetched.

The ohmic contact layer preparation step: for the second semiconductor epitaxial wafer, preparing a mask layer on a surface of the third epitaxial layer, coating a photoresist on the mask layer, photoetching on the photoresist and the mask layer to form a graphical etching mesa, and etching an area outside the graphical etching mesa on the mask layer to the second epitaxial layer to form a graphical ohmic contact layer, and removing the photoresist and the mask layer which have been photoetched.

The active region preparation step: isolating the first semiconductor epitaxial wafer or the second semiconductor epitaxial wafer by utilizing a mesa etching or ion implantation method to form an active region.

The first metal electrode layer preparation step: performing metal evaporating and annealing on the active region to form a first metal electrode layer.

Based on the second aspect, in a first possible implementation manner, after the first metal electrode layer has been formed, the method further includes: depositing a passivation protective layer on a surface of the first semiconductor epitaxial wafer or the second semiconductor epitaxial wafer, and etching out an electrode window.

Based on the second aspect and the first possible implementation manner of the second aspect, in a second possible implementation manner, the first epitaxial layer is a P-type silicon carbide epitaxial layer, the second epitaxial layer is an N-type silicon carbide epitaxial layer, and the graphical ohmic contact layer is an N-type ohmic contact layer; or the first epitaxial layer is an N-type silicon carbide epitaxial layer, the second epitaxial layer is a P-type silicon carbide epitaxial layer, and the graphical ohmic contact layer is a P-type ohmic contact layer.

Advantageous Effects of the Disclosure

Compared with the prior art, the advantageous effect of the disclosure is that the ultraviolet detector provided by the present application includes a detector epitaxial structure composed of a first epitaxial layer, a second epitaxial layer and a graphical ohmic contact layer, wherein the second epitaxial layer is the absorption multiplication region of the ultraviolet detector. When front-incidence is adopted, the absorption of incident photons by the graphical ohmic contact layer is greatly reduced, especially the absorption of short-wavelength photons by the graphical ohmic contact layer. Therefore, the amount of incident photons reaching the absorption multiplication region will be greatly increased, thereby achieving the purpose of improving the quantum efficiency of the ultraviolet detector.

BRIEF DESCRIPTION OF THE DRAWINGS

In order to more clearly illustrate the technical solutions in the embodiments of the present application, the embodiments or the drawings used in the prior art description will be briefly described below, and it is obvious that the drawings in the following description are only some embodiments of the present application, and that other drawings can be obtained from these drawings without involving any inventive effort for a person skilled in the art.

DETAILED DESCRIPTION OF ILLUSTRATIVE EMBODIMENTS

In the following description, for the purpose of illustration rather than limitation, specific details such as a specific system structure and technology are set forth in order to provide a thorough understanding of the embodiments of the present application. However, it will be apparent to a person skilled in the art that the present application may be practiced in other embodiments without these specific details. In other instances, detailed descriptions of well-known systems, devices, circuits, and methods are omitted so as not to obscure the description of the present application with unnecessary detail.

In order to clearly understand the purpose, technical solutions and beneficial effects of the present application, the present application is described in further detail with reference to the accompanying drawings and embodiments.

Figure 1:
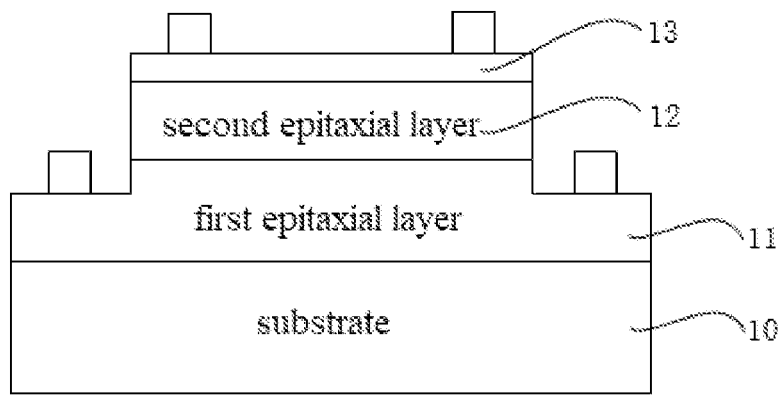
FIG. 1 is the structure schematic diagram of the ohmic contact layer in the ultraviolet detector in the prior art.

Firstly, with reference to FIG. 1 (sectional view), a structure design of the ohmic contact layer in an ultraviolet detector in the prior art is described. The ultraviolet detector provided in FIG. 1 comprises a substrate 10, a first epitaxial layer 11, a second epitaxial layer 12 and an ohmic contact layer 13 from bottom to top. It can be seen that the ohmic contact layer 13 completely covers the top of the second epitaxial layer 12. When the front-incidence is adopted (incident from above to below), the ohmic contact layer 13 can absorb the incident photons, reducing the number of incident photons reaching the second epitaxial layer 12 (absorption multiplication region), thereby reducing the quantum efficiency of the ultraviolet detector.

In the ultraviolet detector provided by an embodiment of the disclosure, the ohmic contact layer is a graphical structure, and the graphical ohmic contact layer reduces the shielding of the second epitaxial layer below the ohmic contact layer, thereby reducing the absorption of incident photons by the ohmic contact layer to improve the quantum efficiency.

Figure 2:
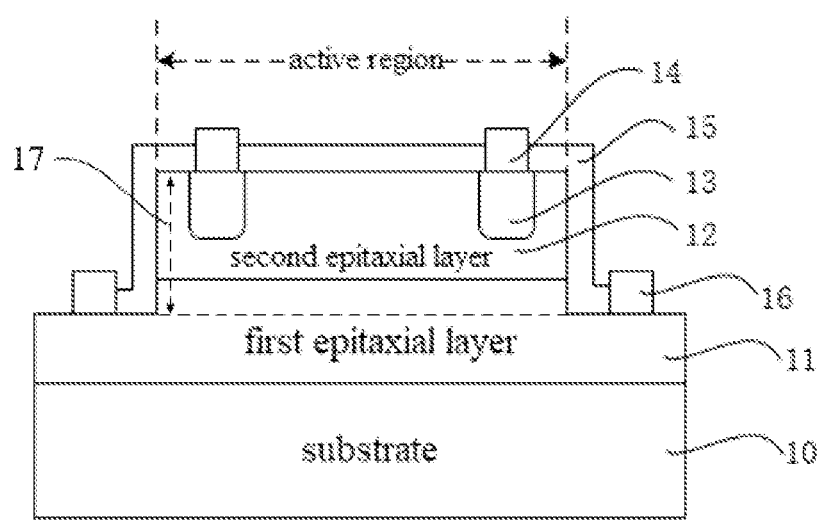
FIG. 2 is a schematic structural diagram of an ultraviolet detector according to an embodiment of the disclosure.

FIG. 2 is a schematic structural diagram (sectional view) of an ultraviolet detector provided by an embodiment of the disclosure. The ohmic contact layer is formed in the second epitaxial layer. The ultraviolet detector provided in FIG. 2 comprises a substrate 10, a first epitaxial layer 11, a second epitaxial layer 12, an ohmic contact layer 13 formed in the second epitaxial layer 12 and a first metal electrode layer 14 located on the ohmic contact layer 13. In this embodiment, the surface graphic of the ohmic contact layer 13 is a circular ring.

In an embodiment of the disclosure, the substrate may be any one of materials such as silicon, sapphire, gallium nitride, or silicon carbide.

In an embodiment of the disclosure, the upper surface of the ohmic contact layer 13 may be level with the upper surface of the second epitaxial layer 12. In practical applications, the ohmic contact layer 13 is formed in the second epitaxial layer 12. The upper surface of the ohmic contact layer 13 may not be lower than the upper surface of the second epitaxial layer 12, and the lower surface of the ohmic contact layer 13 needs to be higher than the lower surface of the second epitaxial layer 12. Specifically, the first epitaxial layer 11, the second epitaxial layer 12 and the ohmic contact layer 13 can jointly form the detector epitaxial structure, wherein, the first epitaxial layer 11 is a heavily doped epitaxial layer; the second epitaxial layer 12 is a lightly doped epitaxial layer, or the second epitaxial layer 12 is a double-layer or multi-layer structure including at least one lightly doped epitaxial layer and at least one heavily doped epitaxial layer; the ohmic contact layer 13 is a graphical heavily doped layer. The ultraviolet detector adopts the method of front incidence, and the entire second epitaxial layer 12 may be a lightly doped epitaxial layer, that is, the absorption multiplication region of the ultraviolet detector; the second epitaxial layer 12 may be a double-layer or multi-layer structure including at least one lightly doped epitaxial layer and at least one heavily doped epitaxial layer, that is, a structure with separate absorption layer and multiplier layer.

In an embodiment of the disclosure, the first metal electrode layer 14 is located on the ohmic contact layer 13, a surface area of the first metal electrode layer is not larger than a surface area of the ohmic contact layer.

In an embodiment of the disclosure, the doping concentration of the ohmic contact layer 13 may be between $1\times10^{18}$~$cm^{-3}$~$1\times10^{20}$ $cm^{-3}$, and the depth of the ohmic contact layer 13 may be between 0.01 µm~0.5 µm. The doping concentration of the first epitaxial layer 11 may be between $1\times10^{18}$ $cm^{-3}$~$1\times10^{20}$ $cm^{-3}$, and the thickness of the first epitaxial layer 11 may be between 1 µm~3 µm. When the second epitaxial layer 12 is a lightly doped single epitaxial layer, its doping concentration may be between $1\times10^{15}$ $cm^{-3}$~$1\times10^{17}$ $cm^{-3}$; while when the second epitaxial layer 12 is a double-layer or multi-layer structure including at least one lightly doped epitaxial layer and at least one heavily doped epitaxial layer, the doping concentration of the lightly doped epitaxial layer may be between $1\times10^{15}$ $cm^{-3}$~$1\times10^{17}$ $cm^{-3}$, and the doping concentration of the heavily doped epitaxial layer may be between $5\times10^{17}$ $cm^{-3}$~$1\times10^{20}$ $cm^{-3}$; and the total thickness of the second epitaxial layer 12 may be between 0.1 µm~50 µm.

In an embodiment of the disclosure, the ultraviolet detector further includes a passivation protection layer to suppress surface leakage of the ultraviolet detector and reduce dark current. As shown in FIG. 2, the passivation protection layer 15 covers an area on an outer surface of the second epitaxial layer 12 without covering an outer surface of the first metal electrode layer 14. The passivation protection layer 15 may be one or any combination of $SiO_2$, $Al_2O_3$, $HfO_2$, $Y_2O_3$, $SiN_x$ materials, and the thickness of the passivation protection layer 15 may be between 50 nm~10 µm.

In an embodiment of the disclosure, as shown in FIG. 2, a surface area of the second epitaxial layer 12 may be smaller than a surface area of the first epitaxial layer 11, and the second epitaxial layer 12 and a partial area on the first epitaxial layer 11 together form an isolation mesa 17 (the upper surface of the isolation mesa 17 is the active region of the ultraviolet detector, and the ohmic contact layer 13 is located in the active region), wherein the partial area on the first epitaxial layer 11 represents a region within which the second epitaxial layer 12 is located on the first epitaxial layer 11.

In an embodiment of the disclosure, the isolation mesa 17 may be a vertical structure with an inclination angle of 90 degrees, or a mesa structure with a non-vertical inclination angle.

Figure 3:
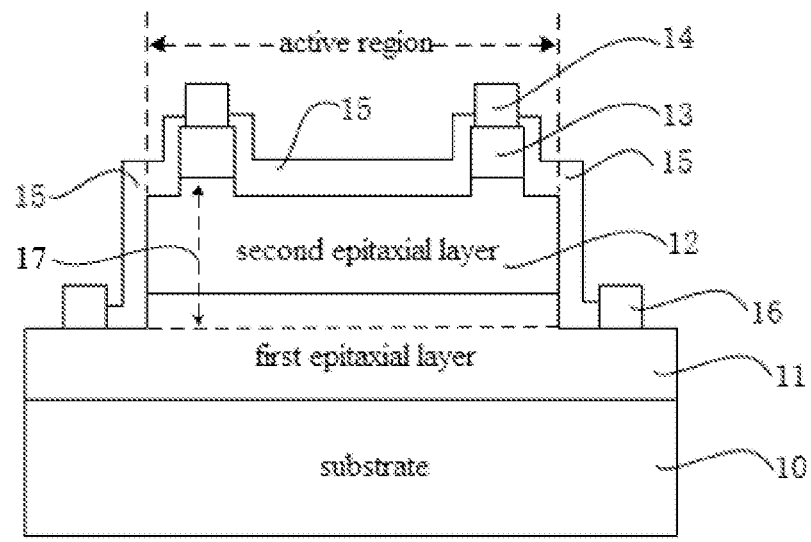
FIG. 3 is a schematic structural diagram of another ultraviolet detector according to an embodiment of the disclosure.

In an embodiment of the disclosure, as shown in FIG. 2 and FIG. 3, the ultraviolet detector further includes a second metal electrode layer 16, and the second metal electrode layer 16 is formed on an area on the first epitaxial layer 11 other than the isolation mesa 17, for example, the second metal electrode layer 16 may be distributed around outside the isolation mesa 17.

Figure 4:
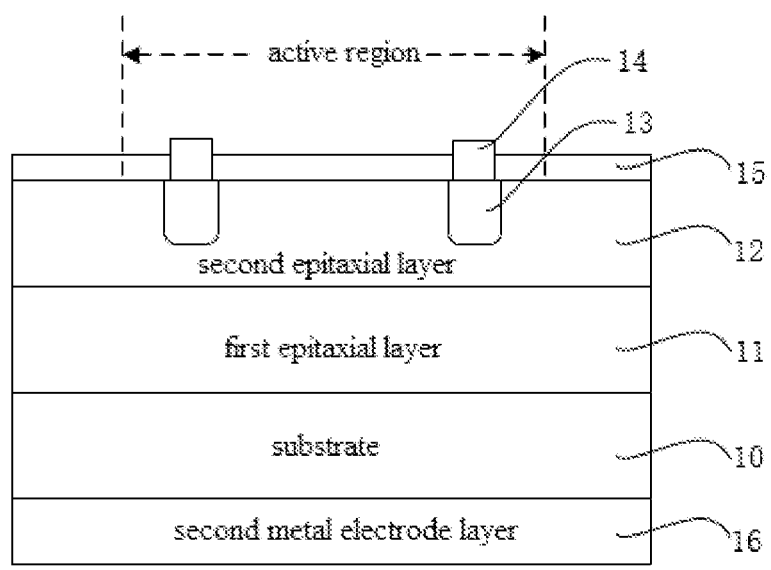
FIG. 4 is a schematic structural diagram of another ultraviolet detector according to an embodiment of the disclosure.
Figure 5:
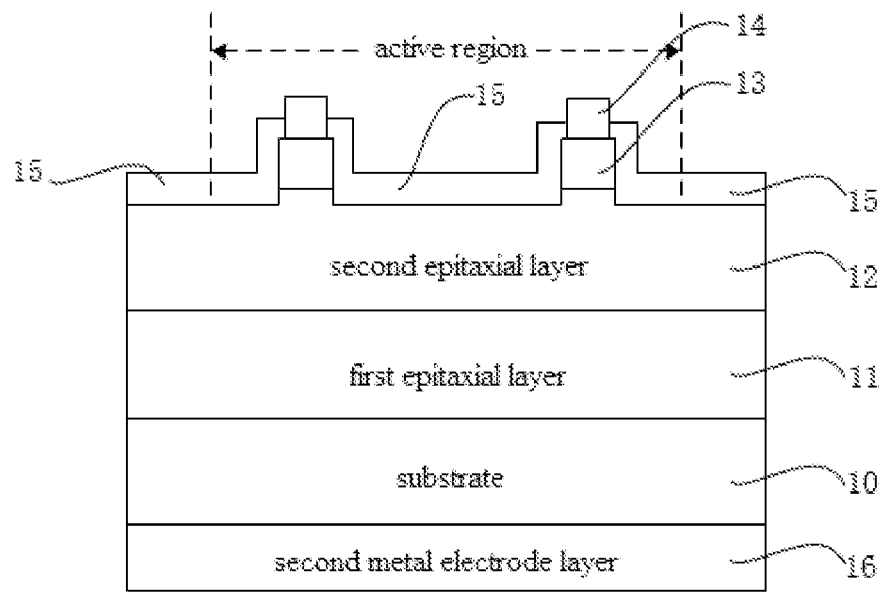
FIG. 5 is a schematic structural diagram of another ultraviolet detector according to an embodiment of the disclosure.

In an embodiment of the disclosure, as shown in FIG. 4 and FIG. 5, the second metal electrode layer 16 may also be located on the other side of the substrate 10, and the other side is opposite to the side of the substrate 10 where the first epitaxial layer 11 is formed, that is, the first epitaxial layer 11 may be located on the side above the substrate 10, and the second metal electrode layer 16 may be located on the side under the substrate 10. In this embodiment, the substrate needs to be heavily doped.

In an embodiment of the disclosure, the first epitaxial layer is a P-type silicon carbide epitaxial layer, the second epitaxial layer is an N-type silicon carbide epitaxial layer, and the ohmic contact layer is an N-type ohmic contact layer; in this embodiment, the first metal electrode layer is the cathode metal electrode layer, which may be electrically connected to the N-type ohmic contact layer; the second metal electrode layer is the anode metal electrode layer, which may be electrically connected to the first epitaxial layer (P-type silicon carbide epitaxial layer). The first epitaxial layer, the second epitaxial layer and the ohmic contact layer form an epitaxial structure of the ultraviolet detector.

In an embodiment of the disclosure, the first epitaxial layer is an N-type silicon carbide epitaxial layer, the second epitaxial layer is a P-type silicon carbide epitaxial layer, and the ohmic contact layer is a P-type ohmic contact layer. In this embodiment, the first metal electrode layer is the anode metal electrode layer, which may be electrically connected to the P-type ohmic contact layer; the second metal electrode layer is the cathode metal electrode layer, which may be electrically connected to the first epitaxial layer (N-type silicon carbide epitaxial layer). The first epitaxial layer, the second epitaxial layer and the ohmic contact layer form an epitaxial structure of the ultraviolet detector.

In an embodiment of the disclosure, P-type and N-type are used to represent different semiconductor materials, P-type represents hole-type semiconductor, N-type represents electron-type semiconductor.

The ultraviolet detector of the embodiment shown in FIG. 2 may be obtained by the following preparation method. The ultraviolet detector of the embodiment shown in FIG. 2 may be referred to as a first ultraviolet detector, and the first ultraviolet detector may be prepared using a method described in the following.

The wafer preparation step: preparing a first semiconductor epitaxial wafer, wherein the first semiconductor epitaxial wafer includes a substrate, a first epitaxial layer and a second epitaxial layer in an order from bottom to top; and the first epitaxial layer is a heavily doped epitaxial layer; the second epitaxial layer is a lightly doped epitaxial layer, or the second epitaxial layer is a double-layer or multi-layer structure including at least one lightly doped epitaxial layer and at least one heavily doped epitaxial layer.

The ohmic contact layer preparation step: preparing a mask layer on the surface of the second epitaxial layer of the first semiconductor epitaxial wafer, coating a photoresist on the mask layer, photoetching on the photoresist and the mask layer to form a graphical ion implantation window, performing ion implantation through the graphical ion implantation window to form a graphical ohmic contact layer, and removing the photoresist and the mask layer which have been photoetched, in other words, removing the photoresist and the mask layer which are outside the graphical ion implantation window. Understandably, after photoetching, the photoresist and the mask layer in the graphical ion implantation window area have been removed.

The active region preparation step: isolating the first semiconductor epitaxial wafer by utilizing a mesa etching method to form an active region.

The first metal electrode layer preparation step: performing metal evaporating and annealing on the active region to form a first metal electrode layer. It can be understood that the metal is evaporated on the active region first, and then annealed in the active region after the metal is evaporated.

In an embodiment of the disclosure, the preparation method may further include the step of preparing the passivation protective layer: after the first metal electrode layer has been formed, depositing a passivation protective layer on the surface of the first semiconductor epitaxial wafer, and etching out an electrode window on the passivation protective layer.

As can be seen from the above, the ultraviolet detector provided by the present application includes a detector epitaxial structure composed of a first epitaxial layer, a second epitaxial layer and a graphical ohmic contact layer, wherein the second epitaxial layer is the absorption multiplication region of the ultraviolet detector. When front-incidence is adopted, the absorption of incident photons by the graphical ohmic contact layer is greatly reduced, especially the absorption of short-wavelength photons by the graphical ohmic contact layer. Therefore, the amount of incident photons reaching the absorption multiplication region will be greatly increased, thereby achieving the purpose of improving the quantum efficiency of the ultraviolet detector.

FIG. 3 is a schematic structural diagram (sectional view) of another ultraviolet detector provided by the embodiment of the disclosure. Different from the embodiment shown in FIG. 2, in the embodiment shown in FIG. 3, the ohmic contact layer 13 of the ultraviolet detector is located on the second epitaxial layer 12. Other structural features of the example ultraviolet detector in FIG. 3 are generally the same as that of the embodiment shown in FIG. 2, and are not repeated here. The ultraviolet detector of the embodiment shown in FIG. 3 may be obtained by the following preparation method. The ultraviolet detector of the embodiment shown in FIG. 3 may be referred to as a second ultraviolet detector, and the second ultraviolet detector may be prepared using a method described in the following.

The wafer preparation step: preparing a second semiconductor epitaxial wafer, wherein the second semiconductor epitaxial wafer includes a substrate, a first epitaxial layer, a second epitaxial layer and a third epitaxial layer in an order from bottom to top; and the first epitaxial layer is a heavily doped epitaxial layer; the second epitaxial layer is a lightly doped epitaxial layer, or the second epitaxial layer is a double-layer or multi-layer structure including at least one lightly doped epitaxial layer and at least one heavily doped epitaxial layer; and the third epitaxial layer is a heavily doped epitaxial layer.

The ohmic contact layer preparation step: preparing a mask layer on the surface of the third epitaxial layer, coating a photoresist on the mask layer, photoetching on the photoresist and the mask layer to form a graphical etching mesa, etching an area outside the graphical etching mesa on the mask layer to the second epitaxial layer to form a graphical ohmic contact layer, and removing the photoresist and the mask layer which have been photoetched, in other words, removing the photoresist and the mask layer which are in the graphical etching mesa. Understandably, after photoetching, the photoresist and the mask layer in the area outside the graphical etching mesa have been removed. And etching an area outside the graphical etching mesa on the mask layer to the second epitaxial layer, that is, removing the third epitaxial layer outside the graphical etching mesa.

The active region preparation step: isolating the second semiconductor epitaxial wafer by utilizing a mesa etching method to form an active region.

The first metal electrode layer preparation step: performing metal evaporating and annealing on the active region to form a first metal electrode layer. It can be understood that the metal is evaporated on the active region first, and then annealed in the active region after the metal is evaporated.

In an embodiment of the disclosure, the preparation method may further include the step of preparing the passivation protective layer: after the first metal electrode layer has been formed, depositing a passivation protective layer on the surface of the second semiconductor epitaxial wafer, and etching out an electrode window on the passivation protective layer.

The ultraviolet detector provided by the embodiment shown in FIG. 2 and FIG. 3 adopts a mesa isolation method, and the active region thereof is the isolation mesa of the ultraviolet detector. FIG. 4 is a schematic structural diagram (sectional view) of another ultraviolet detector provided by an embodiment of the disclosure. Compared with the embodiments shown in FIG. 2 and FIG. 3, the ultraviolet detector in the embodiment shown in FIG. 4 uses ion implantation to achieve isolation of the active region, without the need to make an isolation mesa. And the ohmic contact layer is formed in the second epitaxial layer (refer to the embodiment shown in FIG. 2, which will not be repeated here). Other structural features of the example ultraviolet detector in FIG. 4 are generally the same as that of the embodiment shown in FIG. 2, and are not repeated here.

In addition, in this embodiment, the substrate 10 may be a heavily doped substrate, and the second metal electrode layer 16 may be located on the other side of the substrate 10, and the other side is opposite to the side of the substrate 10 where the first epitaxial layer 11 is formed, that is, the first epitaxial layer 11 may be located on the side above the substrate 10, and the second metal electrode layer 16 may be located on the side under the substrate 10. The preparation method thereof is as follows. The ultraviolet detector of the embodiment shown in FIG. 4 may be referred to as a third ultraviolet detector, and the third ultraviolet detector may be prepared using a method described in the following.

The wafer preparation step: preparing a first semiconductor epitaxial wafer, wherein the first semiconductor epitaxial wafer includes a substrate, a first epitaxial layer and a second epitaxial layer in an order from bottom to top; and the first epitaxial layer is a heavily doped epitaxial layer; the second epitaxial layer is a lightly doped epitaxial layer, or the second epitaxial layer is a double-layer or multi-layer structure including at least one lightly doped epitaxial layer and at least one heavily doped epitaxial layer.

The ohmic contact layer preparation step: preparing a mask layer on the surface of the second epitaxial layer of the first semiconductor epitaxial wafer, coating a photoresist on the mask layer, photoetching on the photoresist and the mask layer to form a graphical ion implantation window, performing ion implantation through the graphical ion implantation window to form a graphical ohmic contact layer, and removing the photoresist and the mask layer which have been photoetched, in other words, removing the photoresist and the mask layer which are outside the graphical ion implantation window. Understandably, after photoetching, the photoresist and the mask layer in the graphical ion implantation window area have been removed.

The active region preparation step: isolating the first semiconductor epitaxial wafer by utilizing an ion implantation method to form an active region.

The first metal electrode layer preparation step: performing metal evaporating and annealing on the active region to form a first metal electrode layer. It can be understood that the metal is evaporated on the active region first, and then annealed in the active region after the metal is evaporated.

The preparation method may further include the step of preparing the passivation protective layer: after the first metal electrode layer has been formed, depositing a passivation protective layer on the surface of the first semiconductor epitaxial wafer, and etching out an electrode window on the passivation protective layer.

The preparation method may also further include the step of preparing the second metal electrode layer: performing metal evaporating and annealing on the other side of the substrate to form a second metal electrode layer, and the other side is opposite to the side on which the first epitaxial layer is formed.

FIG. 5 is a schematic structural diagram of another ultraviolet detector provided by an embodiment of the disclosure. The embodiment shown in FIG. 4 and FIG. 5 both use ion implantation to achieve isolation of the active region, and there is no need to make an isolation mesa. And the ohmic contact layer is located on the second epitaxial layer (refer to the embodiment shown in FIG. 2, which will not be repeated here). Other structural features of the example ultraviolet detector in FIG. 5 are generally the same as that of the embodiment shown in FIG. 2, and are not repeated here.

In addition, in this embodiment, the substrate 10 may be a heavily doped substrate, and the second metal electrode layer 16 may be located on the other side of the substrate 10, and the other side is opposite to the side of the substrate 10 where the first epitaxial layer 11 is formed, that is, the first epitaxial layer 11 may be located on the side above the substrate 10, and the second metal electrode layer 16 may be located on the side under the substrate 10. The preparation method thereof is as follows. The ultraviolet detector of the embodiment shown in FIG. 5 may be referred to as a forth ultraviolet detector, and the forth ultraviolet detector may be prepared using a method described in the following.

The wafer preparation step: preparing a second semiconductor epitaxial wafer, wherein the second semiconductor epitaxial wafer includes a substrate, a first epitaxial layer, a second epitaxial layer and a third epitaxial layer in an order from bottom to top; and the first epitaxial layer is a heavily doped epitaxial layer; the second epitaxial layer is a lightly doped epitaxial layer, or the second epitaxial layer is a double-layer or multi-layer structure including at least one lightly doped epitaxial layer and at least one heavily doped epitaxial layer; and the third epitaxial layer is a heavily doped epitaxial layer.

The ohmic contact layer preparation step: preparing a mask layer on the surface of the third epitaxial layer, coating a photoresist on the mask layer, photoetching on the photoresist and the mask layer to form a graphical etching mesa, etching an area outside the graphical etching mesa on the mask layer to the second epitaxial layer to form a graphical ohmic contact layer, and removing the photoresist and the mask layer which have been photoetched, in other words, removing the photoresist and the mask layer which are in the graphical etching mesa. Understandably, after photoetching, the photoresist and the mask layer in the area outside the graphical etching mesa have been removed. And etching an area outside the graphical etching mesa on the mask layer to the second epitaxial layer, that is, removing the third epitaxial layer outside the graphical etching mesa.

The active region preparation step: isolating the second semiconductor epitaxial wafer by utilizing an ion implantation method to form an active region.

The first metal electrode layer preparation step: performing metal evaporating and annealing on the active region to form a first metal electrode layer. It can be understood that the metal is evaporated on the active region first, and then annealed in the active region after the metal is evaporated.

In an embodiment of the disclosure, the preparation method may further include the step of preparing the passivation protective layer: after the first metal electrode layer has been formed, depositing a passivation protective layer on the surface of the second semiconductor epitaxial wafer, and etching out an electrode window on the passivation protective layer.

The preparation method may also further include the step of preparing the second metal electrode layer: performing metal evaporating and annealing on the other side of the substrate to form a second metal electrode layer, and the other side is opposite to the side on which the first epitaxial layer is formed.

In the above embodiments, the surface graphic of the ohmic contact layer 13 may be a circular ring, a square ring, a window shape or an array shape. The surface graphic of the ohmic contact layer 13 may also be other graphics, as long as it has graphical gaps that allow incident photons to directly pass through.

In the above embodiments, a surface graphic of the first metal electrode layer 14 corresponds to a surface graphic of the ohmic contact layer 13; for example, when the surface graphic of the ohmic contact layer 13 is a circular ring, the surface graphic of the first metal electrode layer 14 may also be a circular ring correspondingly.

Referring to FIG. 6 to FIG. 11, six graphic schematic diagrams (top views) of the surface of the active region of the ultraviolet detector are respectively shown.

Figure 6:
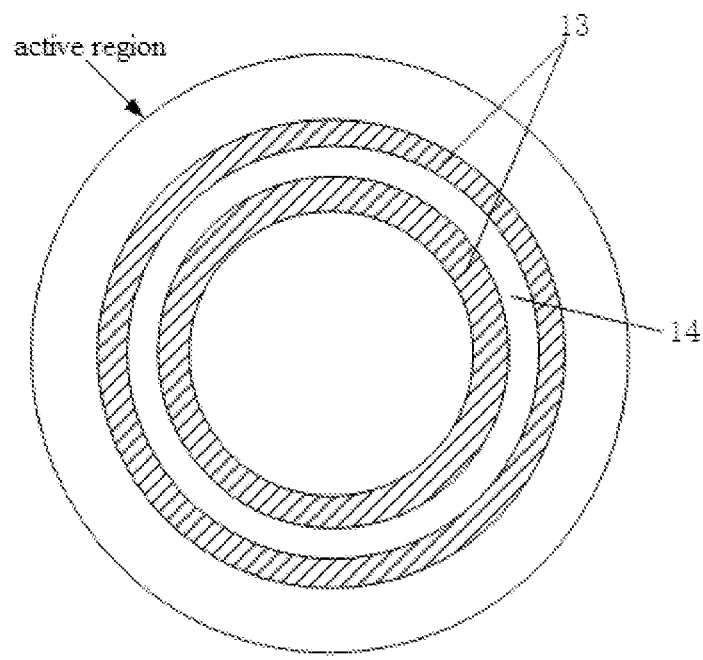
FIG. 6 is a schematic diagram of the surface of the first active region of the ultraviolet detector according to an embodiment of the disclosure.

As shown in FIG. 6, the active region is circular (it may be a circular mesa active region formed by mesa etching, or a circular active region formed by ion implantation), and the surface graphic of the ohmic contact layer 13 is a circular ring (the ohmic contact layer 13 is located in the active region and may be formed in the second epitaxial layer or located on the second epitaxial layer), the surface graphic of the first metal electrode layer 14 located on the ohmic contact layer 13 may also be a circular ring.

Figure 7:
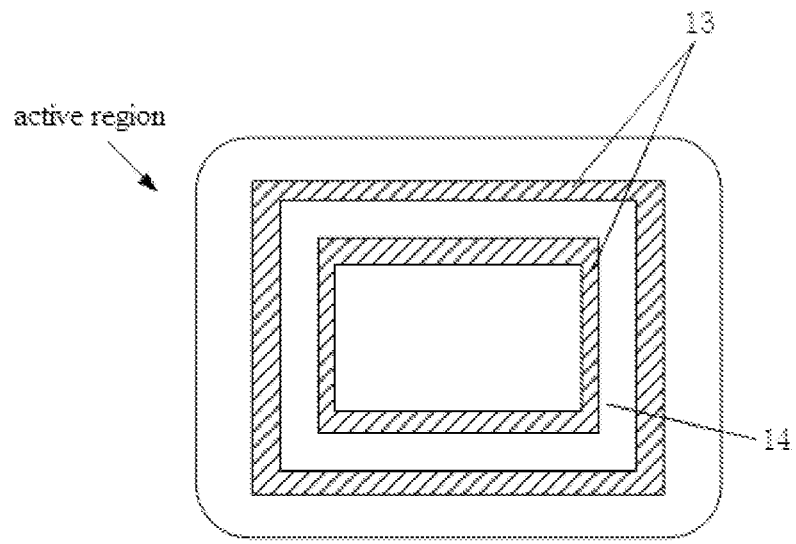
FIG. 7 is a schematic diagram of the surface of the second active region of the ultraviolet detector according to an embodiment of the disclosure.

As shown in FIG. 7, the active region is rectangular (may be a rounded rectangle) (it may be a rectangular mesa active region formed by mesa etching, or a rectangular active region formed by ion implantation), and the surface graphic of the ohmic contact layer 13 is a rectangular ring (the ohmic contact layer 13 is located in the active region and may be formed in the second epitaxial layer or located on the second epitaxial layer), the surface graphic of the first metal electrode layer 14 located on the ohmic contact layer 13 may also be a rectangular ring.

Figure 8:
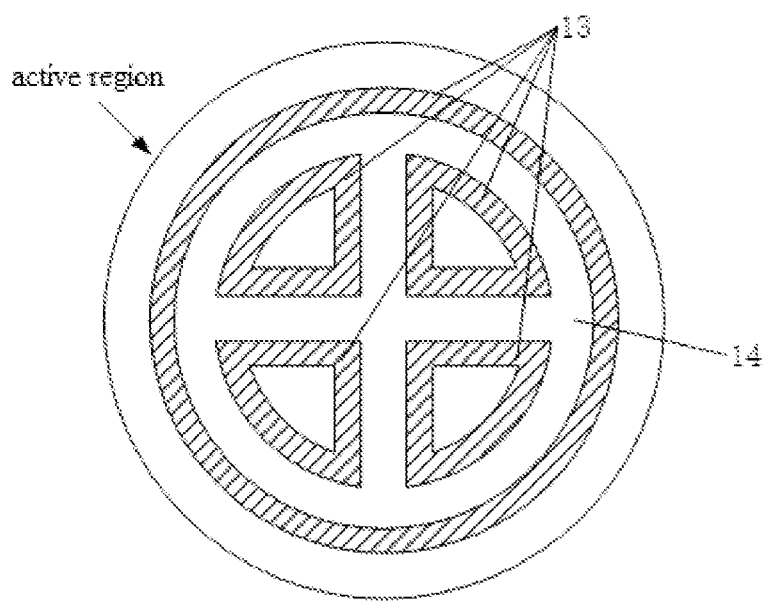
FIG. 8 is a schematic diagram of the surface of the third active region of the ultraviolet detector according to an embodiment of the disclosure.

As shown in FIG. 8, the active region is circular (it may be a circular mesa active region formed by mesa etching, or a circular active region formed by ion implantation), and the surface graphic of the ohmic contact layer 13 is a circular window shape (the ohmic contact layer 13 is located in the active region and may be formed in the second epitaxial layer or located on the second epitaxial layer), the surface graphic of the first metal electrode layer 14 located on the ohmic contact layer 13 may be a circular window shape with cross-connected area inside.

Figure 9:
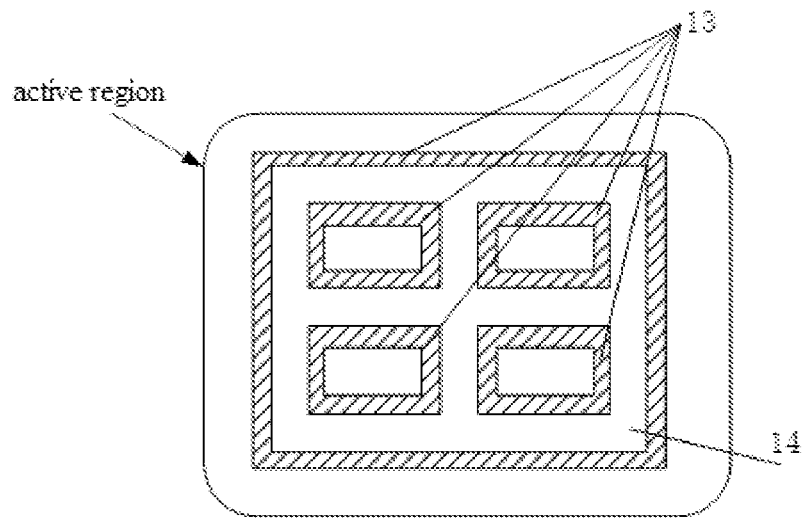
FIG. 9 is a schematic diagram of the surface of the fourth active region of the ultraviolet detector according to an embodiment of the disclosure.

As shown in FIG. 9, the active region is rectangular (may be a rounded rectangle) (it may be a rectangular mesa active region formed by mesa etching, or a rectangular active region formed by ion implantation), and the surface graphic of the ohmic contact layer 13 is a rectangular window shape (the ohmic contact layer 13 is located in the active region and may be formed in the second epitaxial layer or located on the second epitaxial layer), the surface graphic of the first metal electrode layer 14 located on the ohmic contact layer 13 may be a rectangular window shape with cross-connected area inside.

Figure 10:
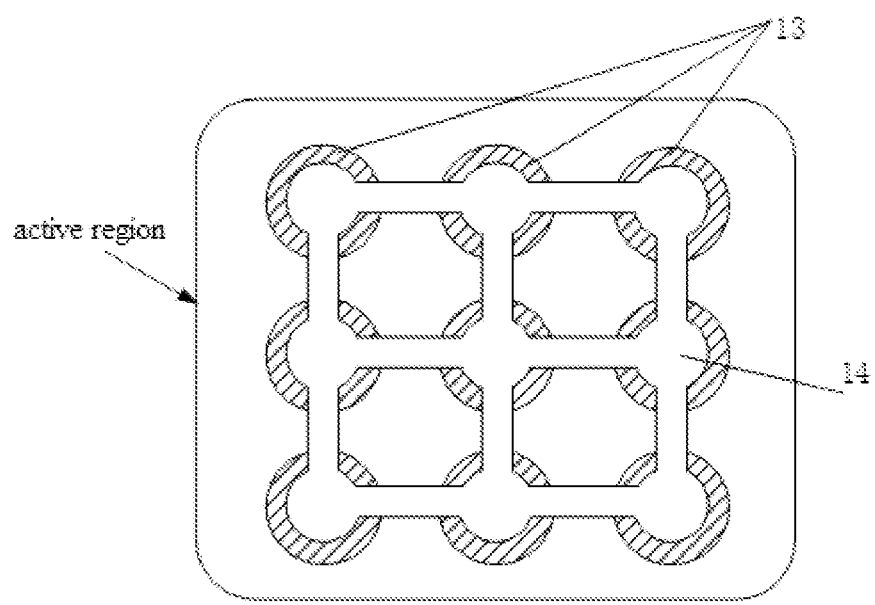
FIG. 10 is a schematic diagram of the surface of the fifth active region of the ultraviolet detector according to an embodiment of the disclosure.

As shown in FIG. 10, the active region is rectangular (may be a rounded rectangle) (it may be a rectangular mesa active region formed by mesa etching, or a rectangular active region formed by ion implantation), and the surface graphic of the ohmic contact layer 13 is a circular array (the ohmic contact layer 13 is located in the active region and may be formed in the second epitaxial layer or located on the second epitaxial layer), the surface graphic of the first metal electrode layer 14 located on the ohmic contact layer 13 may also be a circular array, and each circle in the circular array are connected.

Figure 11:
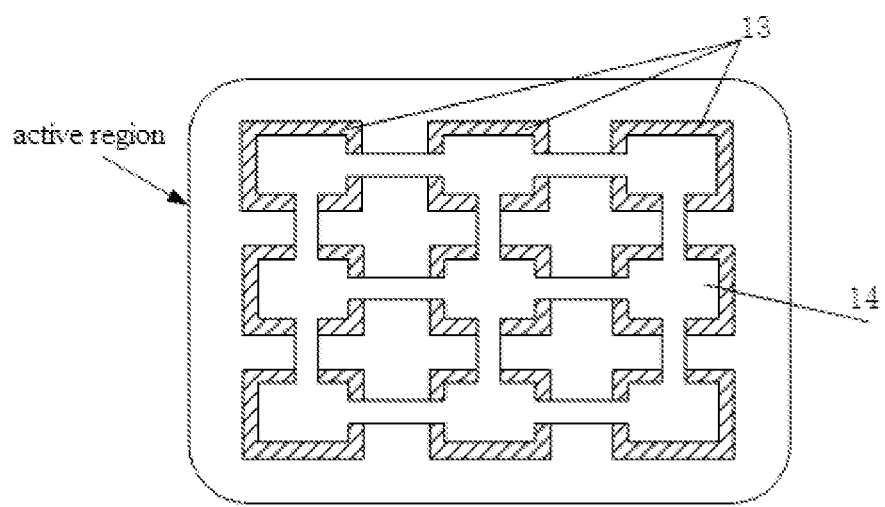
FIG. 11 is a schematic diagram of the surface of the sixth active region of the ultraviolet detector according to an embodiment of the disclosure.

As shown in FIG. 11, the active region is rectangular (may be a rounded rectangle) (it may be a rectangular mesa active region formed by mesa etching, or a rectangular active region formed by ion implantation), and the surface graphic of the ohmic contact layer 13 is a square array (the ohmic contact layer 13 is located in the active region and may be formed in the second epitaxial layer or located on the second epitaxial layer), the surface graphic of the first metal electrode layer 14 located on the ohmic contact layer 13 may also be a square array, and each square in the square array of the first metal electrode layer 14 is connected.

In embodiments of the disclosure, the window-shaped or array-shaped first metal electrode layer forming electrical contact can improve the uniformity of the internal electric field distribution of the ultraviolet detector, thereby facilitating the realization of better avalanche multiplication performance.

The above-mentioned embodiments are only used to illustrate the technical solutions of the disclosure, but not to limit the disclosure; although the present application has been described in detail with reference to the above-mentioned embodiments, those of ordinary skilled in the art should understand that: it is still possible to modify the technical solutions described in the above-mentioned embodiments, or to perform equivalent replacements for some of the technical features. However, these modifications or replacements do not make the essence of the corresponding technical solutions deviate from the spirit and scope of the technical solutions of the embodiments of the present application, and should be included within the protection scope of the present application.

What is claimed is:

1. An ultraviolet detector, comprising:
    a substrate;
    a first epitaxial layer located on the substrate, the first epitaxial layer being a heavily doped epitaxial layer with a doping concentration between $1\times10^{18}$ cm$^{-3}$~$1\times10^{20}$ cm$^{-3}$;
    a second epitaxial layer located on the first epitaxial layer, the second epitaxial layer being a lightly doped epitaxial layer with a doping concentration between $1\times10^{15}$ cm$^{-3}$~$1\times10^{17}$ cm$^{-3}$, or the second epitaxial layer being a double-layer or multi-layer structure comprising at least one lightly doped epitaxial layer with a doping concentration between $1\times10^{15}$ cm$^{-3}$~$1\times10^{17}$ cm$^{-3}$ and at least one heavily doped epitaxial layer with a doping concentration between $5\times10^{17}$ cm$^{-3}$~$1\times10^{20}$ cm$^{-3}$;
    an ohmic contact layer located on the second epitaxial layer or formed in the second epitaxial layer, the ohmic contact layer being a graphical heavily doped layer with a doping concentration between $1\times10^{18}$ cm$^{-3}$~$1\times10^{20}$ cm$^{-3}$, wherein when the ohmic contact layer is formed in the second epitaxial layer, an upper surface of the ohmic contact layer is not lower than an upper surface of the second epitaxial layer, and a lower surface of the ohmic contact layer is higher than a lower surface of the second epitaxial layer, and wherein a surface graphic of the ohmic contact layer includes a window shape or an array shape; and
    a first metal electrode layer, a surface area of the first metal electrode layer touching the ohmic contact layer is not larger than a surface area of the ohmic contact layer, the surface area of the first metal electrode layer is a connected area; when the surface graphic of the ohmic contact layer is the window shape, the first metal electrode layer is entirely located on and in contact with the ohmic contact layer, and a surface graphic of the first metal electrode layer is the window shape; and when the surface graphic of the ohmic contact layer is the array shape, a portion of the first metal electrode layer is located on and in contact with the ohmic contact layer, a connection portion of the first metal electrode layer is located above the second epitaxial layer, and the surface graphic of the first metal electrode layer is the array shape; and wherein the ultraviolet detector further comprises a passivation protection layer that covers an area on an outer surface of the second epitaxial layer without covering an outer surface of the first metal electrode layer;

wherein a surface area of the second epitaxial layer is smaller than a surface area of the first epitaxial layer, and the second epitaxial layer and a partial area on the first epitaxial layer together form an isolation mesa, and wherein the partial area represents a region within which the second epitaxial layer is located on the first epitaxial layer; and the ultraviolet detector further comprises a second metal electrode layer, and the second metal electrode layer is formed on an area on the first epitaxial layer other than the isolation mesa.

2. The ultraviolet detector according to claim 1, wherein the first epitaxial layer is a P-type silicon carbide epitaxial layer, the second epitaxial layer is an N-type silicon carbide epitaxial layer, and the ohmic contact layer is an N-type ohmic contact layer; or the first epitaxial layer is an N-type silicon carbide epitaxial layer, the second epitaxial layer is a P-type silicon carbide epitaxial layer, and the ohmic contact layer is a P-type ohmic contact layer.

3. The ultraviolet detector according to claim 1, wherein a material of the substrate is silicon, sapphire, gallium nitride, or silicon carbide.

4. The ultraviolet detector according to claim 1, wherein a depth of the ohmic contact layer is between 0.01 μm~ 0.5 μm, a thickness of the first epitaxial layer is between 1 μm~ 3 μm, and a total thickness of the second epitaxial layer is between 0.1 μm~ 50 μm.

5. The ultraviolet detector according to claim 1, wherein a material of the passivation protection layer is one or a combination of $SiO_2$, $Al_2O_3$, $HfO_2$, $Y_2O_3$, $SiN_x$, and a thickness of the passivation protection layer is between 50 nm~ 10 μm.

* * * * *